United States Patent [19]

Laibowitz et al.

[11] Patent Number: 4,982,248
[45] Date of Patent: Jan. 1, 1991

[54] GATED STRUCTURE FOR CONTROLLING FLUCTUATIONS IN MESOSCOPIC STRUCTURES

[75] Inventors: Robert B. Laibowitz, Peekskill; Corwin P. Umbach, Katonah, both of N.Y.

[73] Assignee: International Business Machines Corporation, Armonk, N.Y.

[21] Appl. No.: 295,727

[22] Filed: Jan. 11, 1989

[51] Int. Cl.$^5$ .................. H01L 27/01; H01L 27/02; H01L 29/48; H01L 29/80

[52] U.S. Cl. .................................. 357/23.1; 357/41; 357/15; 357/22

[58] Field of Search ............... 357/16, 15, 23.12, 64, 357/23.1, 41, 23.15, 22

[56] References Cited

U.S. PATENT DOCUMENTS

| | | | |
|---|---|---|---|
| 3,584,268 | 6/1971 | Schmidlin | 317/235 |
| 3,736,571 | 5/1973 | Cohen et al. | 340/173 |
| 4,187,513 | 2/1980 | Spellman | 357/1 |
| 4,331,967 | 5/1982 | Kurumada | 357/3 |
| 4,424,525 | 1/1984 | Mimura | 357/23 |
| 4,450,462 | 5/1984 | Nuyen | 357/23 |
| 4,460,412 | 7/1984 | Imura et al. | 148/1.5 |
| 4,488,164 | 12/1984 | Kazarinov et al. | 357/27 |
| 4,550,330 | 10/1985 | Fowler | 357/16 |

OTHER PUBLICATIONS

Muller & Kumins "Device Electronics for Integrated Circuits" pp. 422-423.
Rapid Communications, vol. 30, No. 7, "Magnetoresistance of Small, Quasi-One-Dimensional, Normal-Metal Rings and Lines", by C. P. Umbach, et al., (Received 6 Jul. 1984).
Proposed Structure for Large Quantum Interference Effects, by S. Datta, et al., (Received 26 Nov. 1985).
Physical Review Letters, vol. 56, No. 4, dated 27 Jan. 1986, "Direct Observation of Ensemble Averaging of the Aharonov–Bohm Effect in Normal-Metal Loops", by C. P. Umbach, et al.
Physical Review Letters, vol. 58, No. 7, dated 16 Feb. 1987, "Aharonov–Bohm Effect in Semiconductor Microstructures", by S. Datta and S. Bandvopadhyay.
Nonloca Electrical properties in Mesoscopic Devices, by C. P. Umbach, P. Santhanam, C. Van Haesendonck and R. A. Webb (Received 2 Feb. 1987).

Primary Examiner—Mark Prenty
Attorney, Agent, or Firm—Donald M. Boles

[57] ABSTRACT

A new solid state device based on mesoscopic phenomena is described. A structure of the mesoscopic device includes phase altering scattering sites at various energy levels disposed in proximity to a conductive channel. The carries in the channel, being isolated by a potential barrier, are not in substantial scattering interaction with the phase altering scattering sites in the absence of a sufficiently large voltage at the gate of the mesoscopic device. Increasing the potential at the gate, imposes a localized electric field along the channel, increases the energy levels of the carriers in the channel, and allows the carriers to interact with the phase altering scattering sites, thereby controllably varying the conductance of the channel.

38 Claims, 1 Drawing Sheet 4,982,248

GATED STRUCTURE FOR CONTROLLING FLUCTUATIONS IN MESOSCOPIC STRUCTURES

DESCRIPTION

1. Technical Field

This invention relates generally to microelectronic devices, and more particularly to mesoscopic devices having ultra small dimensions on the order of or less than a phase coherence length.

2. Background Art

Recent advances in VLSI fabrication techniques have made it possible to produce solid state devices with submicron dimensions. The transport properties and operating characteristics of microelectronic devices are expected to change substantially as the size of such devices approaches atomic dimensions. The term "mesoscopic" has been coined to refer to devices with dimensions on the order of a phase coherence length, the characteristic distance a carrier travels before losing phase memory due to inelastic or magnetic scattering.

It has become clear that classical transport models fail to account for the quantum mechanical transport occurring in mesoscopic devices. In large devices containing many scattering sites, the measured conductance reflects an average of all the scattering that occurs. In contrast, in small devices ($L \leq L\emptyset$) there are too few scattering sites present for the scattering to average in such a way as to produce the bulk results. In these small devices, the details of the scattering have a large effect on the device properties. Each particular distribution of scattering sites in a sample will cause electrons to undergo quantum interference in a different way. The quantum interference produces periodic magnetoconductance oscillations in ring shaped microstructure and aperiodic fluctuations in the conductance of line microstructures. Yet, these mesoscopic devices are not much smaller than those currently being manufactured in the state of the art VLSI devices. This suggests that as VLSI devices become smaller, their operating characteristics will be affected, perhaps adversely, by mesoscopic phenomena.

Recently, a great deal of interest was generated by the theoretical prediction and experimental observation of flux periodic resistance oscillations in small cylinders and rings roughly 1 micrometer in diameter. For instance, a paper entitled, "Magnetoresistance of Small, Quasi One-dimensional, Normal-Metal Rings and Lines", by C. P. Umbach, et al., pages 4048-4051, Physical Review B, Volume 30, Number 7, Oct. 1, 1984, first reports and describes aperiodic fluctuations in the magnetoresistance oscillations of very small rings and lines measured at low temperatures. R. A. Webb, S. Washburn, C. P. Umbach and R. B. Laibowitz, Phy. Rev. Letter 54 2696 (1985) describes a first observation of magnetoresistance oscillations periodic in the flux quantum h/e in small rings.

Still more recently, devices based upon quantum interference effects are beginning to appear in the literature. For instance, U.S. Pat. No. 4,550,330, issued Oct. 29, 1985 to A. B. Fowler teaches a mesoscopic interferometer constructed using bifurcated branch conductive paths with each path length of the order of several mean free paths of an electron in the conductive paths. The application of a gate voltage over one of the conductive paths change the wavelengths of certain electrons in the one path. Due to the phase difference between electrons traveling in the two conductive paths caused by the changed wavelengths, interference effects result, which in turn produce controllable variation in the device conductance.

A paper entitled "Proposed Structure for Large Quantum Interference Effects", by S. Datta, pp. 487-489, Applied Physics Letter Vol. 48, No. 7, 1986 describes a mesoscopic ring device also based on quantum interferences resulting from phase difference caused by changing wavelengths in two parallel wells. According to the publication, the device structure consists of two parallel GaAs quantum wells separated by an AlGaAs barrier. The current through the device is determined by the quantum interferences between the two parallel wells and can be controlled by a third terminal which changes the wavelength differences of the electrons in the two parallel quantum wells.

DISCLOSURE OF THE INVENTION

It is a primary object of the present invention to provide a new microelectronic device based on mesoscopic phenomena.

It is a principle object of the present invention to provide a new ultra small solid state device.

It is another object of the present invention to provide a new solid state device adaptable for incorporation in VLSI circuitry.

It is a further object of the present invention to provide a solid state device which is readily fabricated using VLSI fabrication techniques.

These and other objects of the present invention are achieved by providing a new mesoscopic device structure, wherein phase altering scattering sites at various energy levels are disposed in proximity to a conductive channel; the carriers in the channel, being isolated by a potential barrier, are not in substantial interaction with the phase altering scattering sites in the absence of a sufficiently large voltage at the insulated gate of the mesoscopic device; and wherein adjusting the potential at the insulated gate imposes a localized electric field along the channel and controls the access of the carrier in the channel to interact with the phase altering scattering sites, thereby controllably varying the conductance of the channel.

The nature, principle, utility, other objects and features, and advantage of this invention will be apparent from the following more particular description of the invention, as illustrated in the accompanying drawings:

BRIEF DESCRIPTION OF THE DRAWINGS

The details of the invention will be described in connection with the accompanying drawings.

BEST MODE FOR CARRYING OUT THE INVENTION

Figure 1:
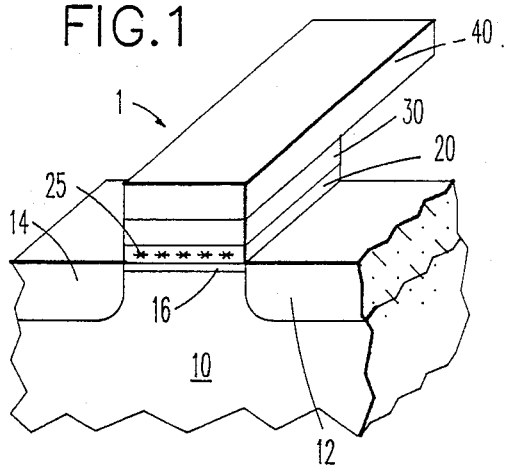
FIG. 1 is a perspective view of a phase coherence length device structure in accordance with the present invention.

Referring to FIG. 1, there is shown a mesoscopic phase coherence length device 1 comprising a conductive channel 16, insulating layer 30 having a thin portion 20 of scattering materials in physical proximity with the channel 16, and a conductive gate 40. The dimensions of the mesoscopic device 1 being less than or comparable to a phase coherence length in the channel 16. Mesoscopic device 1 is preferably constructed with a silicon substrate 10 having a source region 12, a drain region 14, and a conductive channel 16 disposed between the source 12 and drain 14. The conductive channel 16 could be a two dimensional electron gas formed on the surface of the silicon substrate 10 under the action of a DC bias voltage on the gate 40 which could be made of a conductive material, such as aluminum. Thin portion 20 being in physical proximity with the conductive channel 16 is preferably made of silicon carbide, SiC, or other suitable materials having a bandgap relatively larger than that of substrate material 10, doped with a material such as arsenic or boron so that phase altering scattering sites 25 would be formed at different energy levels inside the bandgap of the thin SiC portion 20, which energy levels being higher than the Fermi level in the conductive channel 16. Insulating layer 30 separating the thin portion 20 and channel 16 from the conductive gate 40 is preferably made of a large bandgap material with a bandgap comparable or higher than that of thin portion 20, such as an insulating material, for example, undoped Silicon carbide or diamond. In its quiescent mode, a potential barrier established by thin portion 20 substantially isolates phase altering scattering sites 25 from the carriers in channel 16.

Alternatively, thin portion 20, and thin layer 70 hereinafter, containing phase altering scattering sites could be materials or contain materials producing large amount of high spin-orbit scattering, i.e. materials with high atomic numbers, such as gold: materials containing electron traps, i.e. surface states: magnetic materials, including paramagnetic and ferromagnetic materials, for example, nickel or iron; and materials with unique distributions of elastic scattering sites, preferably formed by ion implantation. While thin layers 20, 70 are shown and described to be continuous layers, they could be portions of layers, islands or discontinuous layers, or such phase altering scattering sites 25, and 75 hereinafter, could be disposed in the form of randomly positioned atoms of such scattering materials.

Figure 4:
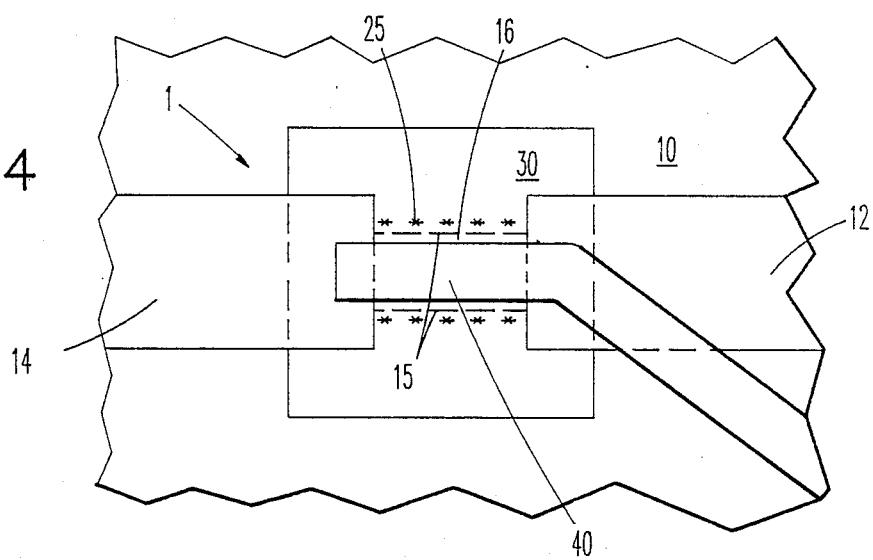
FIG. 4 is a top view of a phase coherent length device showing an alternate arrangement of the phase altering scattering sites at the edges along the channel of the device in accordance with the present invention.

Other arrangements in accordance with the present invention are also possible and can readily be fabricated using commonly known VLSI fabrication techniques. Referring to FIG. 4 which shows a variation of the embodiment in FIG. 1. As in the preferred embodiment in FIG. 1, mesoscopic device 1, supported by substrate 10, comprises a source 12 and drain 14, conductive channel 16, insulating layer 30 and a conductive gate 40. However, instead of a thin portion 20 of scattering materials disposed over the channel 16, scattering sites 25 of such scattering materials could be disposed at the edges 15 along channel 16. In this arrangement, in the quiescent state the scattering sites 25 are outside channel 16 and there is no substantial scattering interaction with the carriers in channel 16. The carriers in the channel 16 come in contact and interact with the phase altering scattering sites 25 when the gate 40 potential increases causing the fringe fields and the conductive channels to widen, and overcome the potential barrier between scattering sites 25 and the carriers, thereby controllably varying the conductivity of channel 16 in the illustrative embodiment of FIG. 4.

Figure 2A:
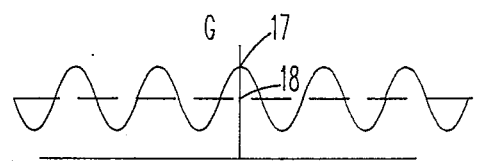
FIG. 2A is a diagram showing a typical periodic magnetoconductance oscillation of a mesoscopic ring microstructure.
Figure 2B:
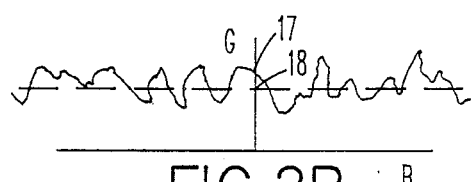
FIG. 2B shows aperiodic magnetoconductance fluctuations occurring in a typical mesoscopic line microstructure.

Referring to FIG. 2, there is shown typical magnetoconductance periodic oscillations for mesoscopic ring structures (FIG. 2A) and aperiodic magnetoconductance fluctuations in mesoscopic line structures (FIG. 2B). The amplitude of magnetoconductance oscillation in such mesoscopic device is given by:

$$\Delta G \leq (e^2/h)(L_{518}/L)^2,$$

where G is the magnetoconductance, e is the electron charge, h is Planck's constant, $L\phi$ is the phase coherence length and L is the device dimension. In principle, the amplitude of the oscillations can increase indefinitely as $L_{518}/L$ increases. Periodic oscillations as large as $\Delta G/G \simeq 20\%$ have been reported in GaAs/AlGaAs heterostructure rings. More particularly, in accordance with the present invention with paramagnetic materials, e.g. a thin layer of Ni, forming scattering sites 25 in the embodiment of FIG. 4, channel 16 of device 1 has a given conductance with a zero bias on gate 40, or a DC bias, as appropriate. In this bias mode, the phase altering scattering sites 25 are not in substantial interaction with the carriers in the channel 16, and device 1 is at state 17 of the oscillatory magnetoconductance curves of FIGS. 2A and 2B, respectively, for ring and line microstructures. Raising the potential by means of a signal at gate 40, raises the energy level of the carriers in channel 16 and brings the carriers in substantial interaction with the phase altering scattering sites 25, thereby controllably altering the conductivity of channel 16 and brings device 1 to state 18 of the dashed magnetoconductance curves of FIGS. 2A and 2B. In another word, the change in conductivity in channel 16 of mesoscopic device 1 is controlled by means of the potential at insulated gate 40. Adjusting the potential at gate 40 impresses a localized electric field over insulating layer 30 along channel 16 and controls the access of the carriers in the channel 16 to interact with the phase altering scattering sites 25. The carriers in channel 16, because of the potential barrier established by thin portion 20, are not able to substantially interact with the phase altering scattering sites 25 in the absence of a sufficiently large voltage at gate 40.

Figure 3:
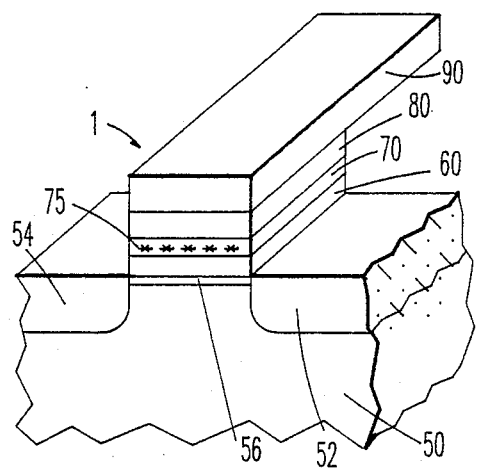
FIG. 3 is a perspective view of a second phase coherence length device structure in accordance with the present invention.

Referring now to FIG. 3, there is shown a second preferred embodiment. In accordance with the present invention, phase coherence length device 1, supported by substrate 50, comprises a conductive channel 56 separated from a thin layer 70 containing phase altering scattering sites 75 by a barrier layer 60 with a bandgap relatively higher than that of substrate 50, and a conductive gate 90 separated from the layer 70 by a large bandgap material 80 having a bandgap higher than that of barrier layer 60. Again, as in the preferred embodiment of FIG. 1, the dimensions of device 1 in this second embodiment are less than or comparable to a phase coherence length in the channel 56. This restriction on device dimension depends on the choice of material used for substrate 10, for instance, for GaAs substrate material, the phase coherence length can be on the order of 1 micrometer at 77° C. This limitation is also a function of temperature, and in general relaxes with decreasing temperature.

Device 1 in accordance with the present invention can be constructed utilizing known VLSI fabrication techniques, including optical and electron beam lithographic technologies, molecular beam epitaxial film deposition, and thermal evaporation using a resistive source or an electron beam gun source. Mesoscopic device 1 of FIG. 3 is preferably fabricated with a gallium arsenide substrate 50 having a drain 54 and a source 52 and conductive channel 56 disposed between drain 54 and source 52. The barrier layer 60 is preferably formed with aluminum gallium arsenide with the conductive channel 56 being a two-dimensional electron gas formed at the interface of the aluminum gallium arsenide layer 60 and gallium arsenide layer 50 heterojunction structure. Preferably, a monolayer of magnetic atoms such as Ni constitutes the phase altering scattering sites 75 in thin layer 70, which scattering sites 75 are being isolated substantially from the carriers in channel 56 by a potential barrier established by barrier layer 60. The large bandgap material 80 could be an insulating material such as SiO2, which serves to isolate the gate 90 which could be made of a conductive material, such as aluminum.

After a conductive path is established in the channel 56, with a DC bias voltage applied to the gate 90 as appropriate, the operation of device 1 requires that the gate 90 be biased such that the channel carriers are initially at energy levels close to but not sufficient to allow the carriers to interact substantially with phase altering scatter sites 75 in thin layer 70. This isolation is accomplished by a potential barrier established by barrier layer 60. Application of a small additional signal voltage to gate 90 raises the energy of the carriers in the channel 56 and causes the carriers to undergo phase altering collisions with the scattering sites 75. The change in the net quantum interference of the carriers in channel 56 caused by their interaction with the additional phase altering scattering sites 75 results in a controlled change of the conductivity of the channel 56, which can be translated into a signal gain or cause device 1 to switch state.

Although the phase altering scattering sites 25 are shown and described to be contained in thin portion 20, in the preferred embodiments of FIGS. 1 and 4, it is understood that scattering sites 25 need only be in physical proximity to the conductive channel 16 such that substantial collisions between carriers in the channel 16 and scattering sites 25 will result upon the application of a signal voltage to gate 40.

The potential barriers in Applicant's preferred embodiments although are shown and described as being established by barrier layers 20, 60, other implementations of potential barriers are also applicable. For instance, the insulating layers 30 and barrier layer 20 of FIG. 1 could be substituted for by a Schottky barrier formed naturally between metal gate 40 and semiconductor substrate 10. Furthermore, scattering sites 25 could also be disposed in the form of randomly positioned atoms of the above suggested scattering materials.

While the operation of phase coherence length device 1 has been shown and described in terms of carriers generally, it is understood by those skilled in this art that channels 16, 56 could be either p-doped or n-doped, with carriers in such channels 16, 56 being holes or electrons, respectively.

Although substrates 10, 50 are shown and described in the preferred embodiments as being semiconductor materials, such as Si or GaAs, other suitable materials, including other III-V compounds and metals could also be used.

From the preceding detailed description of Applicant's invention, it is seen that simple yet novel mesoscopic devices having ultra small dimensions are possible in accordance with the teaching of the present invention. In addition to the variations and modifications of Applicant's described preferred embodiments, which have been suggested, many other variations and modifications will be apparent to those skilled in this art, and accordingly, the scope of Applicant's invention is not to be construed to be limited to the particular embodiments shown or suggested.

Having thus described Applicant's invention, what is claimed as new, and desired to be secured by Letters Patent is:

1. A solid state device comprising:
a substrate of a given bandgap having a source region, a drain region, and a conductive channel disposed therebetween;
phase altering scattering sites being at various energy levels and in proximity to said conductive channel;
barrier means for creating a potential barrier to isolate said phase altering scattering sites from carriers in said conductive channel, said barrier means isolated in the absence of an applied electric field; and
means for impressing a localized electric field disposed over said barrier means along said conductive channel to vary the energy level of carriers in said channel, such that said phase altering scattering sites change the phase altering interactions of said carriers and control the conductivity of said conductive channel.

2. A solid state device in accordance with claim 1 wherein said substrate is a semiconductor material.

3. A solid state device in accordance with claim 2 wherein said means for impressing a localized electric field is a metal gate and said barrier means is a Schottky barrier formed by said metal gate over said semiconductor.

4. A solid state device in accordance with claim 3 wherein said phase altering scattering sites are made of high spin-orbit scattering material.

5. A solid state device in accordance with claim 3 wherein said phase altering scattering sites are elastic scattering material.

6. A solid state device in accordance with claim 3 wherein said phase altering scattering sites are magnetic material.

7. A solid state device in accordance with claim 3 wherein said phase altering scattering sites are disposed along the edges of said conductive channel.

8. A solid state device in accordance with claim 1 wherein said means for impressing a localized electric field is an insulated conductive gate.

9. A solid state device in accordance with claim 8 wherein said phase altering scattering sites are made of high spin-orbit scattering material.

10. A solid state device in accordance with claim 8 wherein said phase altering scattering sites are elastic scattering material.

11. A solid state device in accordance with claim 8 wherein said phase altering scattering sites are magnetic material.

12. A solid state device in accordance with claim 8 wherein said phase altering scattering sites are disposed along the edges of said conductive channel.

13. A solid state device in accordance with claim 1 wherein said barrier means is a barrier layer having a bandgap greater than said given bandgap overlying said conductive channel.

14. A solid state device in accordance with claim 13 wherein said phase altering scattering sites are disposed in the form of randomly positioned atoms of such sites.

15. A solid state device in accordance with claim 13 wherein said phase altering scattering sites are disposed along the edges of said conductive channel.

16. A solid state device in accordance with claim 13 wherein said phase altering scattering sites are disposed in the form of a layer of elastic scattering material.

17. A solid state device comprising:
a substrate of a given bandgap having a source region, a drain region, and a conductive channel disposed therebetween;
a scattering material having phase altering scattering sites at various energy levels;
barrier means for creating a potential barrier to isolate said phase altering scattering sites from carriers in said conductive channel, said barrier means isolated in the absence of an applied electric field;
an insulating layer having a bandgap greater than the bandgap of said barrier means disposed over said scattering material; and
means for impressing a localized electric field over said insulating layer along said conductive channel to vary the energy level of carriers in said channel, such that said phase altering scattering sites change the phase altering interactions of said carriers and control the conductivity of said conductive channel.

18. A solid state device in accordance with claim 17 wherein said substrate is GaAs, said barrier means is AlGaAs, and said means for impressing a localized electric field is a conductive gate.

19. A solid state device in accordance with claim 18 wherein said phase altering scattering sites are disposed in the form of a layer of magnetic material.

20. A solid state device in accordance with claim 18 wherein said phase altering scattering sites are disposed in the form of a layer of high spin-orbit scattering material.

21. A solid state device in accordance with claim 18 wherein said phase altering scattering sites are disposed in the form of a layer of elastic scattering material.

22. A solid state device in accordance with claim 17 wherein said substrate is a semiconductor material, said scattering material is a metallic layer, said barrier means is a Schottky barrier formed by said metallic layer of said scattering material over said semiconductor substrate material, and said means for impressing localized electric field is a conductive gate.

23. A solid state device in accordance with claim 22 wherein said metallic layer of said scattering material is nickel.

24. A solid state device comprising:
a semiconductor substrate of a given bandgap having a source region, a drain region, and a conductive channel disposed therebetween;
phase altering scattering sites being at various energy levels and in proximity to said conductive channel;
Schottky barrier means for creating a potential barrier to isolate said phase altering scattering sites from carriers in said conductive channel, said barrier means isolated in the absence of an applied electric field; and
metal gate means disposed over said semiconductor substrate for impressing a localized electric field to said Schottky barrier means along said conductive channel so as to vary the energy level of carriers in said channel, and to change the phase altering interactions of said carriers with said phase altering scattering sites and controlling the conductivity of said channel.

25. A solid state device in accordance with claim 24 wherein said phase altering scattering sites are made of high spin-orbit scattering material.

26. A solid state device in accordance with claim 24 wherein said phase altering scattering sites are elastic scattering material.

27. A solid state device in accordance with claim 24 wherein said phase altering scattering sites are magnetic material.

28. A solid state device in accordance with claim 24 wherein said phase altering scattering sites are disposed along the edges of said conductive channel.

29. A solid state device in accordance with claim 24 wherein said means for impressing a localized electric field is an insulated conductive gate.

30. A solid state device in accordance with claim 29 wherein said phase altering scattering sites are disposed along the edges of said conductive channel.

31. A solid state device in accordance with claim 24 wherein said barrier means is a barrier layer having a bandgap greater than said given bandgap overlying said conductive channel.

32. A solid state device in accordance with claim 30 wherein said phase altering scattering sites are disposed in the form of randomly positioned atoms of such sites.

33. A solid state device in accordance with claim 30 wherein said phase altering scattering sites are disposed along the edges of said conductive channel.

34. A solid state device in accordance with claim 30 wherein said phase altering scattering sites are disposed in the form of a layer of elastic scattering material.

35. A solid state device comprising:
a GaAs substrate of a given bandgap having a source region, a drain region, and a conductive channel disposed therebetween;
a scattering material having phase altering scattering sites at various energy levels;
a barrier means of a semiconductor material having a bandgap size higher than that of GaAs for creating a potential barrier to isolate said altering scattering sites from carriers in said conductive channel, said barrier means isolated in the absence of an applied electric field;
an insulating layer having a bandgap greater than the bandgap of said barrier means disposed over said scattering material; and
conductive means for impressing a localized electric field over said insulating layer along said conductive channel to vary the energy level of carriers in said channel, thereby changing the phase altering interactions of said carriers with said phase altering scattering sites and controlling the conductivity of said channel.

36. A solid state device in accordance with claim 35 wherein said phase altering scattering sites are disposed in the form of a layer of magnetic material.

37. A solid state device in accordance with claim 34 wherein said phase altering scattering sites are disposed in the form of a layer of high spin-orbit scattering material.

38. A solid state device in accordance with claim 34 wherein said phase altering scattering sites are disposed i the form of a layer of elastic scattering material.

* * * * *